(12) United States Patent
Benveniste et al.

(10) Patent No.: US 6,879,109 B2
(45) Date of Patent: Apr. 12, 2005

(54) THIN MAGNETRON STRUCTURES FOR PLASMA GENERATION IN ION IMPLANTATION SYSTEMS

(75) Inventors: Victor M. Benveniste, Gloucester, MA (US); William F. DiVergilio, Beverly, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 123 days.

(21) Appl. No.: 10/600,775

(22) Filed: Jun. 20, 2003

(65) Prior Publication Data

US 2004/0227470 A1 Nov. 18, 2004

Related U.S. Application Data

(60) Provisional application No. 60/470,926, filed on May 15, 2003.

(51) Int. Cl.$^7$ .............................................. H05H 1/24
(52) U.S. Cl. ................. 315/111.21; 315/224; 118/728; 438/706; 356/369
(58) Field of Search ........................... 315/111.21, 224; 118/728, 723; 438/706, 715, 720; 356/369, 364

(56) References Cited

U.S. PATENT DOCUMENTS

| | | | | |
|---|---|---|---|---|
| 5,343,047 A | * | 8/1994 | Ono et al. ............. | 250/492.21 |
| 5,429,855 A | * | 7/1995 | Kotani et al. ............... | 428/141 |
| 5,780,863 A | | 7/1998 | Benveniste et al. | |
| 5,783,492 A | * | 7/1998 | Higuchi et al. ............. | 438/710 |
| 5,969,366 A | | 10/1999 | England et al. | |
| 6,056,848 A | * | 5/2000 | Daviet .................. | 156/345.48 |
| 6,143,129 A | * | 11/2000 | Savas et al. ........... | 156/345.48 |
| 6,160,262 A | | 12/2000 | Aoki et al. | |
| 6,312,555 B1 | * | 11/2001 | Daviet ..................... | 118/723 I |
| 6,326,631 B1 | | 12/2001 | Politiek et al. | |
| 6,441,382 B1 | | 8/2002 | Huang | |
| 6,489,622 B1 | | 12/2002 | Chen et al. | |
| 6,521,895 B1 | | 2/2003 | Walther et al. | |
| 6,559,942 B2 | * | 5/2003 | Sui et al. ..................... | 356/369 |
| 6,652,709 B1 | * | 11/2003 | Suzuki et al. ........... | 315/111.21 |
| 6,755,150 B2 | * | 6/2004 | Lai et al. .................. | 118/723 I |
| 2002/0179854 A1 | | 12/2002 | Tsukihara et al. | |
| 2003/0066976 A1 | | 4/2003 | Chen et al. | |

OTHER PUBLICATIONS

"Charged Particle Beams", Acceleration and Transport of Neutralized Ion Beams, Stanley Humphries, Jr., 1990, pp. 528–534.

* cited by examiner

Primary Examiner—Michael Tokar
Assistant Examiner—Lam T. Mai
(74) Attorney, Agent, or Firm—Eschweiler & Associates LLC

(57) ABSTRACT

A plasma generator for space charge neutralization of an ion beam is disclosed and resides within an ion implantation system operable to generate an ion beam and direct the ion beam along a beamline path. The plasma generator comprises an electric field generation system operable to generate an electric field in a portion of the beamline path, and a magnetic field generation system operable to generate a magnetic field in the portion of the beamline path, wherein the magnetic field is perpendicular to the electric field. The plasma generator further comprises a gas source operable to introduce a gas in a region occupied by the electric field and the magnetic field. Electrons in the region move in the region due to the electric field and the magnetic field, respectively, and at least some of the electrons collide with the gas in the region to ionize a portion of the gas, thereby generating a plasma in the region.

47 Claims, 14 Drawing Sheets

THIN MAGNETRON STRUCTURES FOR PLASMA GENERATION IN ION IMPLANTATION SYSTEMS

RELATED APPLICATION

This application claims priority to U.S. Application Ser. No. 60/470,926 filed May 15, 2003, which is entitled "High Mass Resolution Magnet for Ribbon Beam Ion Implanters".

FIELD OF THE INVENTION

The present invention relates generally to ion implantation systems, and more particularly to a plasma generation system and method associated therewith to neutralize space charge associated with an ion beam.

BACKGROUND OF THE INVENTION

Ion implantation systems are used to dope semiconductors with impurities in integrated circuit manufacturing. In such systems, an ion source ionizes a desired dopant element, which is extracted from the source in the form of an ion beam. The ion beam is typically mass analyzed to select ions of a desired charge-to-mass ratio and then directed at the surface of a semiconductor wafer in order to implant the wafer with the dopant element. The ions of the beam penetrate the surface of the wafer to form a region of desired conductivity, such as in the fabrication of transistor devices in the wafer. A typical ion implanter includes an ion source for generating the ion beam, a beamline assembly including a mass analysis apparatus for mass resolving the ion beam using magnetic fields, and a target chamber containing the semiconductor wafer or workpiece to be implanted by the ion beam.

Typical ion beam implanters include an ion source for generating positively charged ions from ionizable source materials. The generated ions are formed into a beam and directed along a predetermined beam path to an implantation station. The ion beam implanter may include beam forming and shaping structures extending between the ion source and the implantation station. The beam forming and shaping structures maintain the ion beam and bound an elongated interior cavity or passageway through which the beam passes en route to the implantation station.

The mass of an ion relative to the charge thereon (i.e., charge-to-mass ratio) affects the degree to which it is accelerated both axially and transversely by an electrostatic or magnetic field. Therefore, the beam which reaches a desired area of a semiconductor wafer or other target can be made very pure since ions of undesirable molecular weight will be deflected to positions away from the beam and implantation of other than desired materials can be avoided. The process of selectively separating ions of desired and undesired charge-to-mass ratios is known as mass analysis. Mass analyzers typically employ a mass analysis magnet creating a dipole magnetic field to deflect various ions in an ion beam via magnetic deflection in an arcuate passageway that will effectively separate ions of different charge-to-mass ratios.

In order to achieve a desired implantation for a given application, the dose and energy of the implanted ions may be varied. The ion dose controls the concentration of implanted ions for a given semiconductor material. Typically, high current implanters are used for high dose implants, while medium current implanters are used for lower dose applications. The ion energy is used to control junction depth in semiconductor devices, where the energy levels of the beam ions determine the degree to which ions are implanted or the depth of the implanted ions within the semiconductor or other substrate material. The continuing trend toward smaller semiconductor devices requires a mechanism that serves to deliver high beam currents at low energies. The high beam current provides the necessary dose levels, while the low energy permits shallow implants.

For shallow depth ion implantation, high current, low energy ion beams are desirable. In this case, the reduced energies of the ions cause some difficulties in maintaining convergence of the ion beam due to the mutual repulsion of ions bearing a like charge. High current ion beams typically include a high concentration of similarly charged ions that tend to diverge due to mutual repulsion. To maintain low energy, high current ion beam integrity at low pressures, a plasma may be created to surround the ion beam. High energy ion implantation beams typically propagate through a weak plasma that is a byproduct of the beam interactions with the residual or background gas. This plasma tends to neutralize the space charge caused by the ion beam, thereby largely eliminating transverse electric fields that would otherwise disperse the beam. However, at low ion beam energies, the probability of ionizing collisions with the background gas is lower. Moreover, in the dipole magnetic field of a mass analyzer, plasma diffusion across magnetic field lines is greatly reduced while the diffusion along the direction of the field is unrestricted. Consequently, introduction of additional plasma to improve low energy beam containment in a mass analyzer is largely futile, since the introduced plasma is quickly diverted along the dipole magnetic field lines to the passageway chamber walls.

Another problem associated with plasma for space charge neutralization is that a plasma source occupies space within the optical element at issue, which then must be configured to be large enough for both the plasma source and the ion beam. Such additional space is costly in terms of power consumption for the optical element and also increases the difficulty of implementation.

In ion implantation systems, there remains a need for a beam containment apparatus and methodologies for use with ion implantation systems including high energy systems, as well as high current, low energy ion beams which may be operated at low pressures, and which provides uniform beam containment along the entire length of a mass analyzer beam guide or other portions of the system.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention is directed to a plasma generation system for use in ion implantation systems. The plasma generation system, in accordance with one exemplary aspect of the present invention, comprises an electric field generation system and a magnetic field generation system. The resultant electric field and magnetic field have portions thereof that are perpendicular to each other causing electrons in such regions be trapped or circulate therein. At least some of the moving electrons collide with a gas in the region causing an ionization thereof, thereby producing a plasma.

In accordance with one example, the plasma generation system takes little space in the ion implantation system by forming electrodes in a mass analyzer system. The electrodes are configured such that, upon biasing, an electric field is generated having a direction that is perpendicular to the dipole magnetic field already residing in the mass analyzer system. In the above manner, the magnetic field generation system is simply the mass analyzer, allowing the space needed for generation of plasma in the mass analyzed to be minimized.

In accordance with another aspect of the present invention, an ion beam implantation system has a mass analyzer system configured for mass analysis of either a pencil-shaped or a ribbon-shaped ion beam. In one example for a ribbon beam, the mass analyzer comprises a pair of laterally extending coils that extend in a width direction of the beam, and wherein lateral ends of the coils define opposing sides of the mass analyzer. When current conducts through the coils, a magnetic field is generated normal to a direction of propagation of the ribbon beam through the mass analyzer beam guide. The invention further comprises a pair of electrodes disposed on one of the sides of the mass analyzer, substantially disposed between the coils. The electrodes are configured to generate an electric field therebetween that is generally perpendicular to the dipole field within the mass analyzer generated by the coils, thereby creating a magnetron type effect and trapping some electrons in a region local thereto. The trapped electrons move in the region, and at least some of the electrons collide with a gas within the region, resulting in an ionization thereof for generation of plasma.

In accordance with yet another aspect of the present invention, the ribbon beam type mass analyzer has an electric field generation system on one of the opposing sides thereof. The electric field generation system comprises two arcuately extending conductive segments, wherein each of the segments have a plurality of electrodes associated therewith extending along the arcuate passageway, and wherein the two segments are electrically isolated from one another. The two groups of electrodes associated with the respective segments are biased with respect to one another to generate an electric field therebetween.

In one example, the generated electric field is oriented perpendicularly with the dipole magnetic field within the mass analyzer. In another example, the magnetic field is generated by a plurality of multi-cusp magnets extending along the arcuate passageway on the analyzer sidewall associated with the electric field. The magnets generate a plurality of multi-cusp magnetic fields along the passageway local to the side, and at least a portion thereof are perpendicular to the electric field. In yet another example, the plurality of conductive electrodes extending arcuately along the conductive segments and are themselves magnets for generation of the multi-cusp fields.

In accordance with still another aspect of the present invention, a method of generating a plasma along a portion of a beamline path in an ion implantation system is provided. The method comprises generating an electric field and a magnetic field having orientations that are generally perpendicular to one another. The perpendicular fields tend to trap electrons in a region local thereto, causing the electrons to move in the region where the electrons collide with gas therein for ionization thereof.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
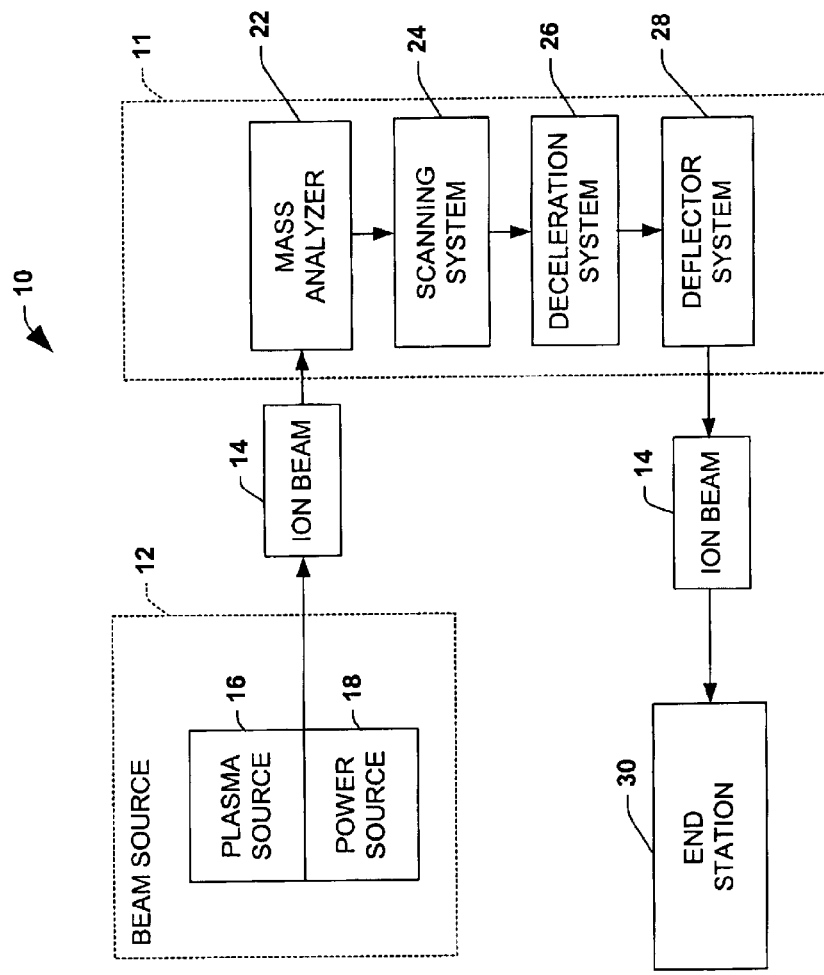
FIG. 1 is a schematic block diagram illustrating components of an exemplary ion implantation system in accordance with one or more aspects of the present invention.

The present invention will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present invention and the appended claims.

The present invention pertains to a system and method of forming plasma in an ion implantation system. The system and related method involve generating perpendicular electric and magnetic fields, resulting in moving electrons within a defined region. The moving electrons collide with gas within the region and cause an ionization of the gas, resulting in a plasma for use in space charge neutralization of the ion beam. A further appreciation of the invention, along with the various aspects thereof will be further understood in accordance with the detailed description below.

Referring initially to FIG. 1, an ion implantation system 10 suitable for implementing one or more aspects of the present invention is depicted in block diagram form. The system 10 includes an ion source 12 for producing an ion beam 14 along a beam path. The ion beam source 12 includes, for example, a plasma source 16 with an associated power source 18. The plasma source 16 may, for example, comprise a plasma confinement chamber from which an ion beam is extracted. The extracted beam can be a pencil or ribbon-type ion beam. One exemplary ribbon beam that may be employed in conjunction with the present invention is disclosed in U.S. application Ser. No. 10/136,047, filed on May 1, 2002, and assigned to the assignee of the present invention, and is hereby incorporated by reference in its entirety.

A beamline assembly 11 is provided downstream of the ion source 12 to receive the beam 14 therefrom. The beamline assembly 11 may include a mass analyzer 22, a scanner 24, a deceleration system 26, and a deflector system 28. The beamline assembly 11 is situated along the path to receive the beam 14. The mass analyzer 22 includes a field generating component, such as a magnet (not shown), and operates to provide a field across the beam path so as to deflect ions from the ion beam 14 at varying trajectories according to charge to mass ratio. Ions traveling through the magnetic field experience a force which directs individual ions of a desired mass along the beam path and which deflects ions of undesired mass away from the beam path.

The scanner 24 is operable to adjust a direction of the beamline axis in order to direct or "scan" the beam across the workpiece in a controlled fashion. The scanner may be electrostatic or magnetic and any such scanning mechanism or other type systems may be employed in conjunction with the present invention. The beamline 11 further comprises a deceleration module 26 that is controllable and selectively operable to alter an energy associated with the beam. For example, at medium energies no substantial change in beam energy may be necessary, and the module allows the beam to pass therethrough without a substantial change thereto. Alternatively, in low energies applications (e.g., for formation of shallow junctions in a semiconductor body), the energy of the beam may need to be decelerated. In such circumstances, the deceleration module 26 is operable to reduce the energy of the beam to a desired energy level by deceleration thereof.

The beamline may further comprise a deflection system 28, for example, for use in low energy systems that employ deceleration prior to implantation into a workpiece. The deflection system 28 includes, for example, deflection electrodes for deflecting the ion beam away from the beamline axis to thereby remove neutral particles that may otherwise serve as energy contaminants.

Continuing with FIG. 1, an end station 30 is also provided in the system 10 to receive the mass analyzed, substantially decontaminated ion beam 14 from the beamline assembly 11. The end station 30 supports one or more workpieces such as semiconductor wafers (not shown) along the beam path (however, offset from the original beamline axis due to the deflector 28) for implantation using the ribbon ion beam 14.

Figure 2:
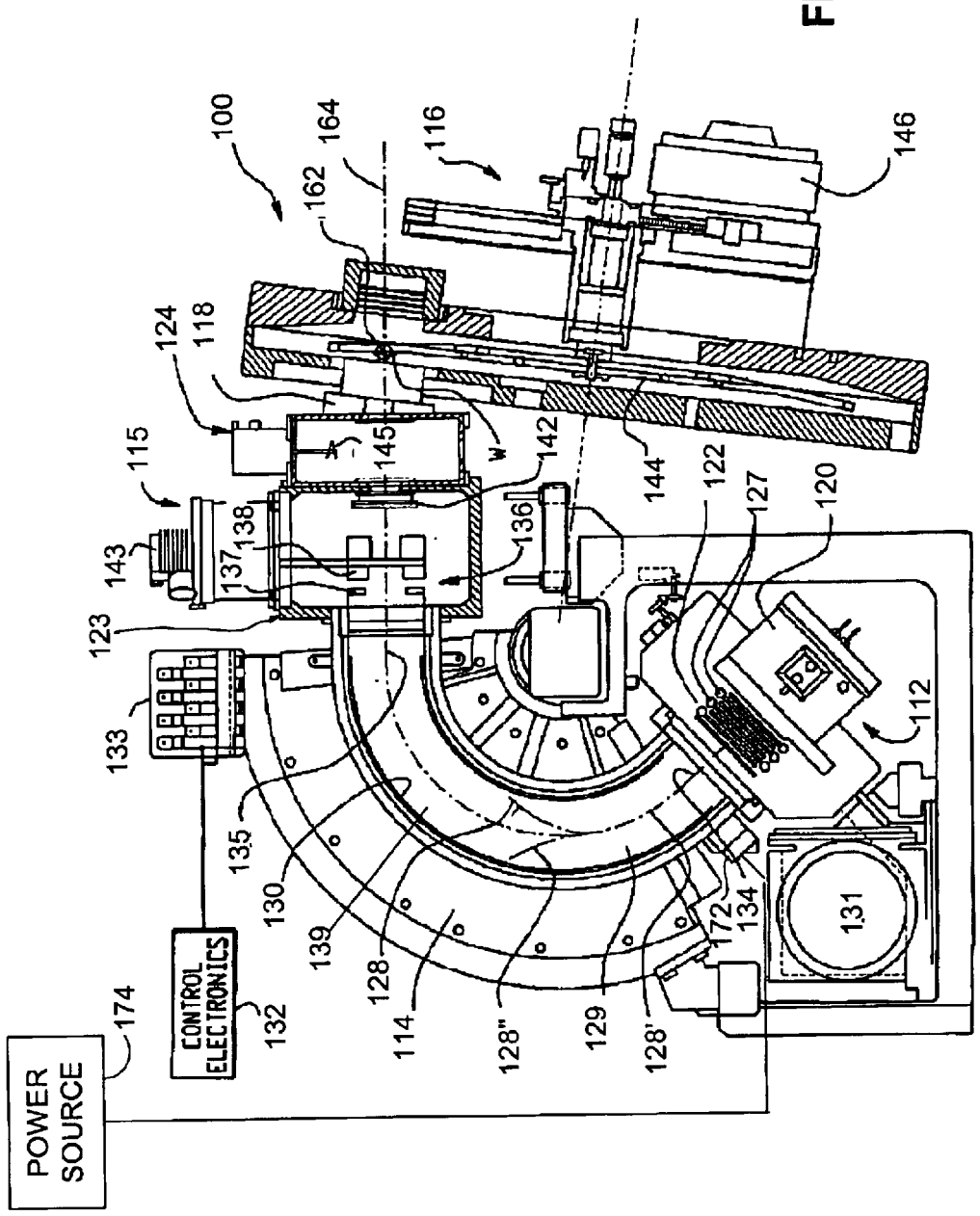
FIG. 2 is a schematic view of a low energy type ion implantation system in which various aspects of the invention may be carried out.

Referring also to FIG. 2, an exemplary low energy ion implanter 100 is illustrated in greater detail in order to appreciate various aspects of the present invention. The implanter 100 has an ion source 112, a mass analysis magnet 114, a beamline assembly 115, and a target or end station 116. A bellows assembly 118, which permits movement of the end station 116 with respect to the beamline assembly 115, connects the end station 116 and the beamline assembly 115. Although FIG. 2 illustrates an ultra low energy (ULE) ion implanter, as will be appreciated, the present invention has applications in other types of implanters as well.

The ion source 112 comprises a plasma chamber 120 and an ion extractor assembly 122. Energy is imparted to an ionizable dopant gas to generate ions within the plasma chamber 120. Generally, positive ions are generated, although the present invention is applicable to systems wherein negative ions are generated by the source 112. The positive ions are extracted through a slit in the plasma chamber 120 by the ion extractor assembly 122, which comprises a plurality of electrodes 127. Accordingly, the ion extractor assembly 122 functions to extract a beam 128 of positive ions from the plasma chamber 120 and to accelerate the extracted ions into the mass analysis magnet 114.

The mass analysis magnet 114 functions to pass only ions of an appropriate charge-to-mass ratio to the beamline assembly 115, which comprises a resolver housing 123 and a beam neutralizer 124. The mass analysis magnet 114 includes a curved beam path 129 within a passageway 139 defined by a beam guide having sidewalls 130, evacuation of which is provided by a vacuum pump 131. The ion beam 128 that propagates along this path 129 is affected by the magnetic field generated by the mass analysis magnet 114, to reject ions of an inappropriate charge-to-mass ratio. The strength and orientation of this dipole magnetic field is controlled by control electronics 132 which adjust the electrical current through the field windings of the magnet 114 through a magnet connector 133.

The dipole magnetic field causes the ion beam 128 to move along the curved beam path 129 from a first or entrance trajectory 134 near the ion source 112 to a second or exit trajectory 135 near the resolving housing 123. Portions 128' and 128' of the beam 128, comprised of ions having an inappropriate charge-to-mass ratio, are deflected away from the curved trajectory and into the walls of an aluminum beam guide 130. In this manner, the magnet 114 passes to the resolving housing 123 only those ions in the beam 128 that have the desired charge-to-mass ratio.

The resolver housing 123 includes a terminal electrode 137, an electrostatic lens 138 for focusing the ion beam 128, and a dosimetry indicator such as a Faraday flag 142. The beam neutralizer 124 includes a plasma shower 145 or a plasma generator in accordance with the present invention (as will be described in greater detail infra) for neutralizing the positive charge that would otherwise accumulate on the target wafer as a result of being implanted by the positively charged ion beam 128. The beam neutralizer and resolver housings are evacuated by a vacuum pump 143.

Downstream of the beam neutralizer 124 is the end station 116, which includes a disk-shaped wafer support 144 upon which workpieces such as wafers to be treated are mounted. The wafer support 144 resides in a target plane that is generally perpendicularly oriented to the direction of the implant beam. The disc shaped wafer support 144 at the end station 116 is rotated by a motor 146. The ion beam thus strikes wafers mounted to the support as they move in a circular path. The end station 116 pivots about point 162, which is the intersection of the path 164 of the ion beam and the wafer W, so that the target plane is adjustable about this point. Although FIG. 2 illustrates a batch type processing system, it should be understood that the present invention is also applicable to single wafer type processing systems.

Figure 3:
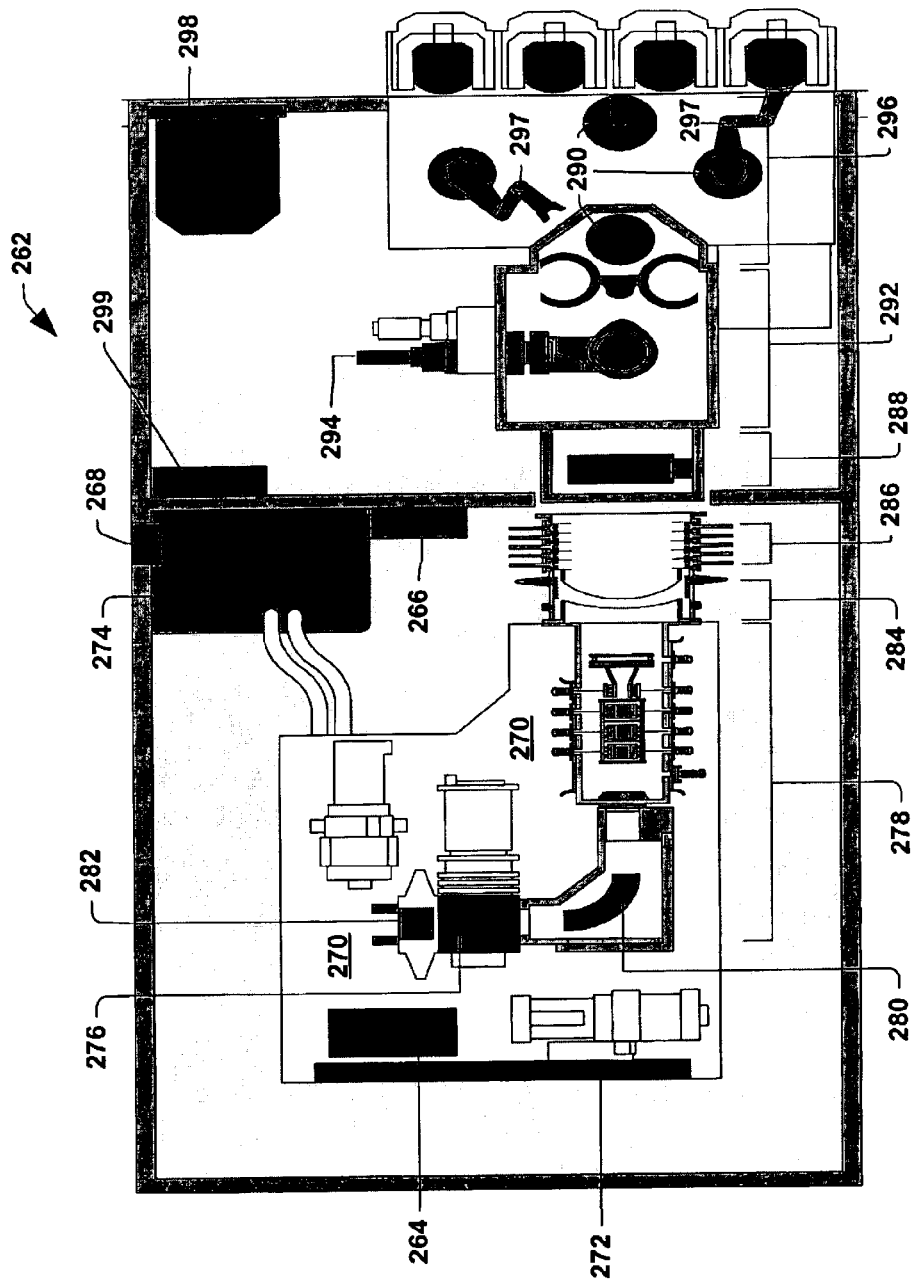
FIG. 3 is a schematic view of a medium current type ion implantation system in which various aspects of the invention may be carried out.

FIG. 3 illustrates yet another ion implantation system 262, for example, a medium current system suitable for implementing one or more aspects of the present invention. The system 262 includes a modular gas box 264, an auxiliary gas box 266 and a gas box remote purge control panel 268. The gas boxes 264, 268 comprise, among other things, one or more gases of a dopant substance, and the boxes 264, 268 facilitate selective delivery of the gas(es) into an extended life ion source 282 within the system 262, wherein the gas(es) can be ionized to generate ions suitable for implantation into wafers or workpieces selectively brought into the system 262. The gas box remote control panel 268 facilitates venting or purging gas(es) or other substances out of the system 262 on an as needed or desired basis.

High voltage terminal power distribution 272 and a high voltage isolation transformer 274 are included to, among other things, electrically excite and impart energy to the dopant gas(es) to generate ions from the gas(es). An ion beam extraction assembly 276 is included to extract ions from the ion source 282 and accelerate them into a beamline 278, which includes a mass analysis magnet 280. The mass analysis magnet 280 is operable to sort out or reject ions of an inappropriate charge-to-mass ratio. In particular, the mass analysis magnet 280 comprises a beamguide having curved sidewalls into which ions of an undesired mass-to-charge ratio collide as they are propagated through the beamguide by way of one or more magnetic fields generated by magnet(s) of the mass analysis magnet 280.

A component 284 may be included to assist with controlling the angle of the scanned ion beam. This may include, among other things, a scan angle correction lens. An acceleration/deceleration column 286 facilitates controlling and adjusting the speed, and/or focusing, of ions within the ion beam. A component 288 operable to filter out contaminant particles, such as a final energy filter may also be included to mitigate energy contaminating particles from encountering wafers or workpieces.

Wafers or workpieces 290 are loaded into an end station chamber 292 for selective implantation with ions. A mechanical scan drive 294 maneuvers the wafers within the chamber 292 to facilitate selective encounters with the beam(s). The wafers or workpieces 290 are moved into the end station chamber 292 by a wafer handling system 296, which may include, for example, one or more mechanical or robotic arms 297. An operator console 298 allows an operator to regulate the implantation process by selectively controlling one or more components of the system 262. Finally, a power distribution box 299 is included to provide power to the overall system 262.

Figure 4:
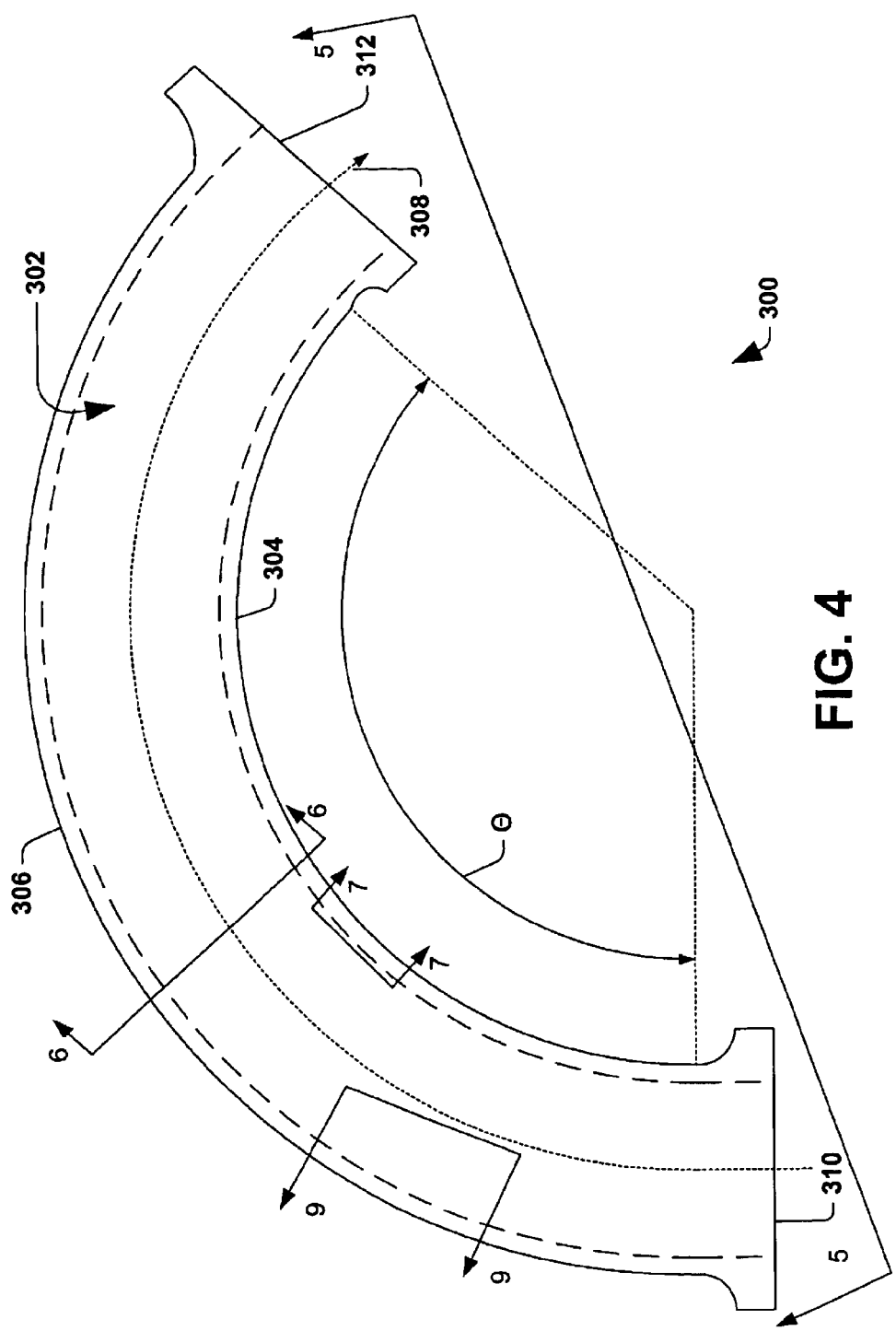
FIG. 4 is a top plan view of an exemplary mass analyzer beam guide according to an aspect of the invention.

FIG. 4 illustrates an exemplary mass analyzer beam guide 300 for use in an ion implantation system (e.g., the analyzer 12 of FIG. 1, the analyzer 114 of FIG. 2, or the analyzer 280 of FIG. 3), having an arcuate longitudinal passageway 302 defined by inner and outer arcuate side walls 304 and 306, respectively, along an ion beam path 308. The beam guide 300 extends longitudinally along the path 308 from an entrance end 310 to an exit end 312 through an arc angle that may be approximately 135 degrees, for example. Beam guide 300 further comprises a mass analysis magnet that may comprising two arcuate magnet poles or a pair of coils (not shown in FIG. 4) to provide a dipole magnetic field in the passageway 302 that allows ions of a selected charge-to-mass ratio to reach the exit end 312 along the path 308. Note that depending upon the type of ion implantation system, the beam guide 300 may deflect a pencil-type beam or a ribbon type beam, as will be appreciated further below.

Figure 5:
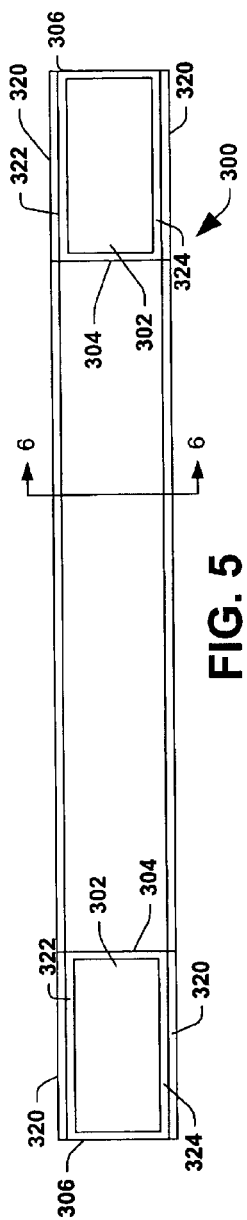
FIG. 5 is an end elevation view of the exemplary mass analyzer of FIG. 4 having magnets for generating a dipole magnetic field in accordance with another aspect of the invention.
Figure 6:
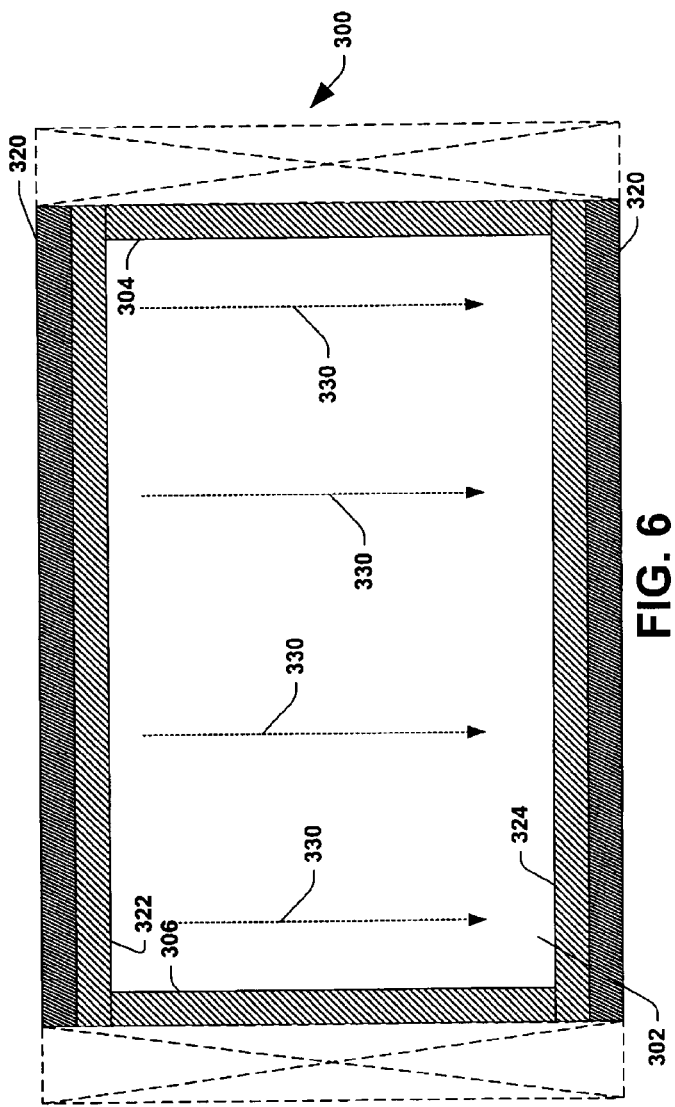
FIG. 6 is a sectional plan view of the exemplary mass analyzer taken along line 6—6 of FIG. 4.

FIGS. 5 and 6 illustrate an end elevation view and a sectional plan view, respectively, of the exemplary mass analyzer beam guide 300 of FIG. 4, having coils associated therewith for generating a dipole magnetic field 330 in the passageway 302 in accordance with an aspect of the invention. The coils extend longitudinally along the path 308 in an arcuate manner, as illustrated. In some cases, however, magnets 320 are employed. Alternatively, the beam guide may employ a combination of permanent magnets and coils, as may be desired, and such variations are contemplated by the present invention. The arcuate passageway 302 is further defined by top and bottom walls 322 and 324, respectively.

Note that the mass analyzer beam guide 300 of FIGS. 5 and 6 may preferably be employed in conjunction with a pencil-type ion beam since the gap between the magnet pole pieces need not be too great. As will be appreciated, the mass analyzer guide may be configured differently for different types of ion beams, for example, a ribbon-shaped ion beam.

Figure 7:
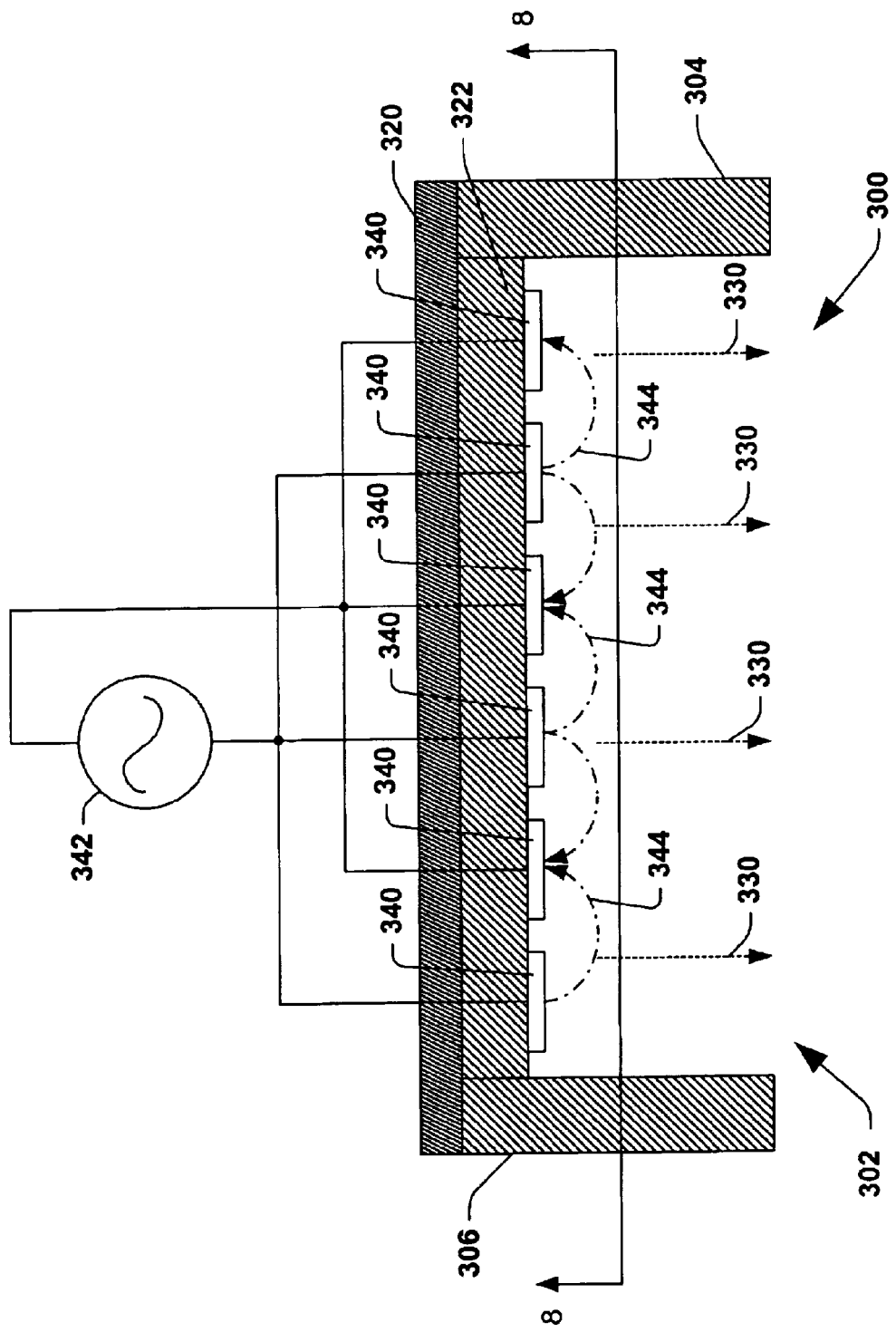
FIG. 7 is a sectional side elevation view of the exemplary mass analyzer taken along line 7—7 of FIG. 4.

Turning now to FIG. 7, two or more electrodes 340 are employed within at least a portion of the beamguide 300. The electrodes 340 are coupled to a bias source 342, for example, an RF source, as illustrated. The RF source is operable to generate a potential difference between the electrodes 340 to thereby generate an electric field 344 therebetween. The electric field 344 has at least a portion thereof that is oriented perpendicular to the magnetic field 330 within the passageway 302. In the above manner, the electrodes 340 operate as an electric field generator while the magnets 320 operate as a magnetic field generator. The crossing fields create a magnetron effect, wherein regions exist where electrons are trapped and move in a generally cycloidal fashion. The electrons moving within the region continue moving until they collide with a gas, and at least some of the electrons have sufficient energy to ionize portions of the gas, thereby generating a plasma. In the above example, by using the background magnetic field 330 already existing for mass analysis, a plasma generator is provided in a relatively simple manner by adding the electrodes 340 and configuring the electrodes such that the resultant electric fields have at least a portion thereof that are perpendicular to the magnetic field.

Figure 8:
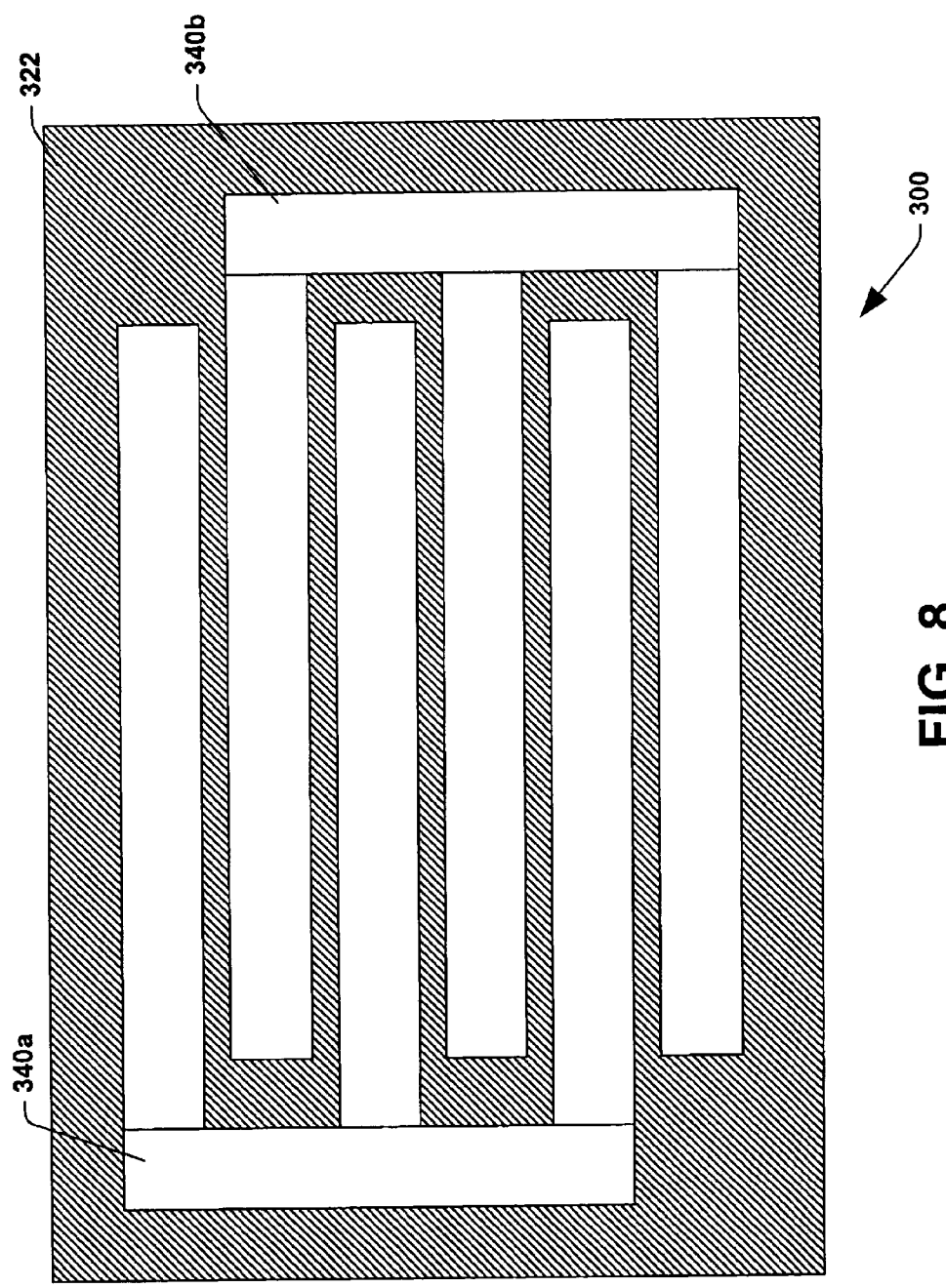
FIG. 8 is a sectional side elevation view of an exemplary mass analyzer taken along line 8—8 of FIG. 7.

FIG. 8 is a plan view illustrating an inside portion of a section within the passageway 302 taken along line 8—8 of FIG. 7. Note that in FIG. 8, the electrodes 340 are configured to form a pair of interdigitated electrodes 340a and 340b. The above arrangement allows for the power source 342 to have a more simplified coupling arrangement. The exemplary configuration of FIG. 8 also allows for trapping regions for electrons to be distributed to various areas along the passageway 302. Further, the configuration of FIG. 8 may be extended to traverse the arcuate passageway 302, wherein the electrode pairs 340a and 340b may also be arcuately configured so as to provide for plasma generation along an entire length of the beam path 308.

The plasma generator structure disclosed above has a number of advantages compared to conventional plasma sources. One advantage is that the electrodes 340 take very little space along the wall of the analyzer. Thus the generator can be made to be a small fraction of the magnetic gap that may be highly advantageous with pencil type beams where the gap is relatively small to begin with. Keeping the gap small helps reduce power needed in the optical elements. In addition, the plasma generator of the present invention advantageously is operable to provide the plasma throughout the beamguide, by generating plasma along the beamline length and diffusing thereacross along the magnetic field lines. As is generally appreciated, plasma sees a substantial resistance across magnetic field lines, but can readily diffuse along such field lines. Thus plasma generated along a wall of the guide may readily diffuse across to the opposing guide, thereby providing for a relatively uniform plasma.

Although the plasma generator of the present invention is described above in conjunction with the mass analyzer system, it should be understood that the present invention is not limited thereto. Rather, the present invention may be employed within various portions of the beamline where space charge neutralization may be advantageous. For example, in a deceleration portion of a low energy ion implantation system, beam transport is often conducted at relatively high energies for purposes of transport efficiency and then decelerated prior to implantation at the workpiece. With such deceleration, the beam perveance increases and space charge neutralization thereat may be advantageous to prevent beam blow-up. The plasma generator of the present invention may employed in that context or in other areas along the beamline and such alternatives are contemplated as falling within the scope of the present invention.

Figure 9A:
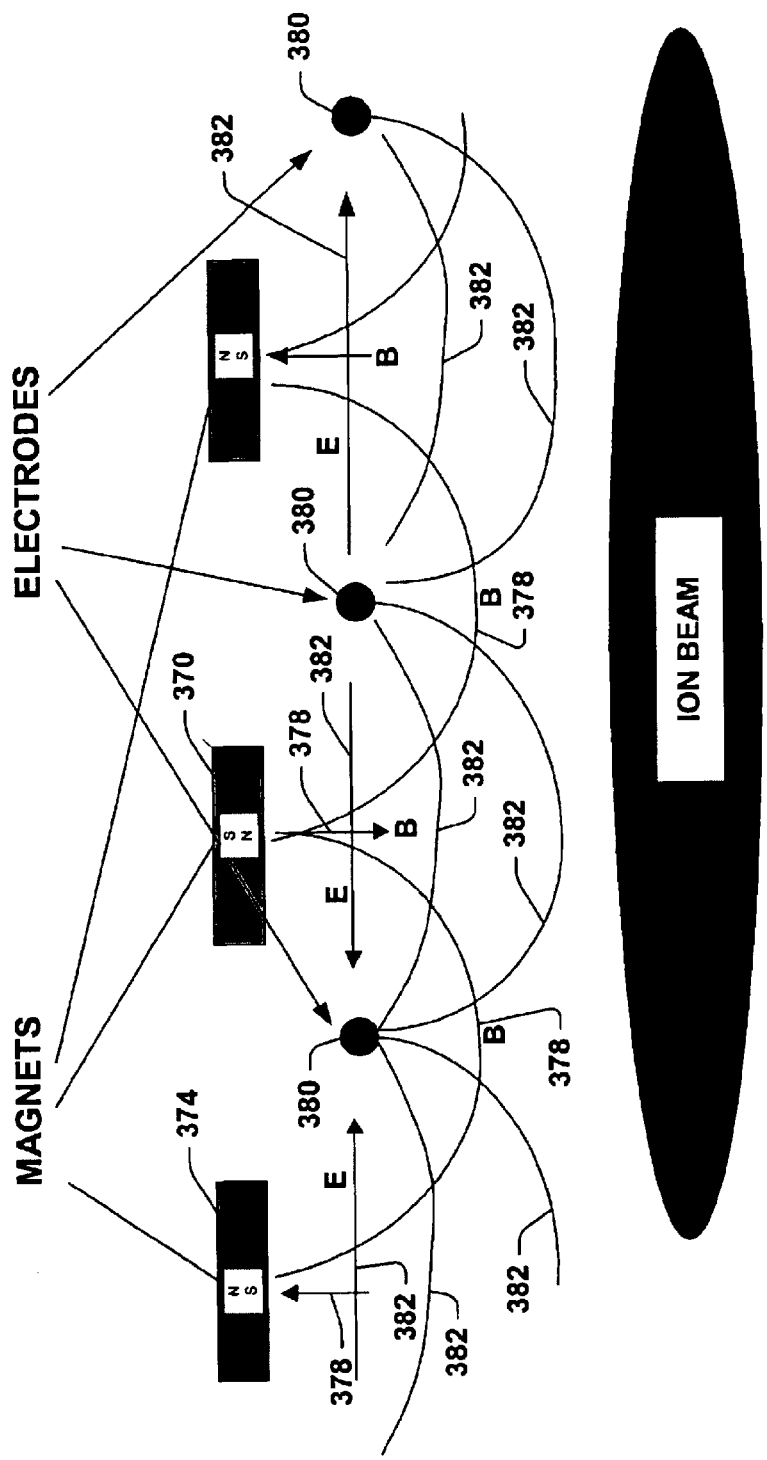
FIG. 9A is a simplified schematic diagram illustrating extension of principles of the present invention using multi-cusp fields.

As discussed above, the present invention may be employed in regions other than the mass analyzer, for example, in drift regions along the beam path. In such instances, the plasma generator may take a form similar to that in FIG. 9A, where no magnetic field is already present for optical purposes. In this region, a multi-cusp magnetic field may be generated using a plurality of magnets having opposing poles. For example, as illustrated in FIG. 9A, a first magnet 370 may have a first pole and a second pole while a neighboring magnet 374 then has a second pole and first pole reversed. Such an arrangement results in a plurality of multi-cusp magnetic fields 378, as illustrated.

Still referring to FIG. 9A, the multi-cusp magnets are interlaced with electrodes 380 that, upon biasing as discussed above, produce electric fields 382, wherein at least a portion of the magnetic and electric fields 378, 382 are perpendicular to one another. Since the multi-cusp magnetic fields 378 produced by the magnets fall off or decay rapidly at a distance away from the magnets, the magnetic fields do not affect the ion beam trajectory.

The example of FIG. 9A is illustrated with the electrodes and magnets being in differing planes, however, such illustration is exemplary. Alternatively, the magnets and electrodes may be formed in an alternating fashion along a wall associated with the beam path. In another alternative, the magnets themselves may also be electrodes and employed, as will be further appreciated in the discussion infra in conjunction with FIG. 9B. Lastly, although the example provided above provides for plasma generation solely with multi-cusp magnetic fields along with perpendicular electric fields, it should be understood that the present invention contemplates use of multi-cusp magnetic fields along with a dipole magnetic field for the magnetic field generator.

Figure 9B:
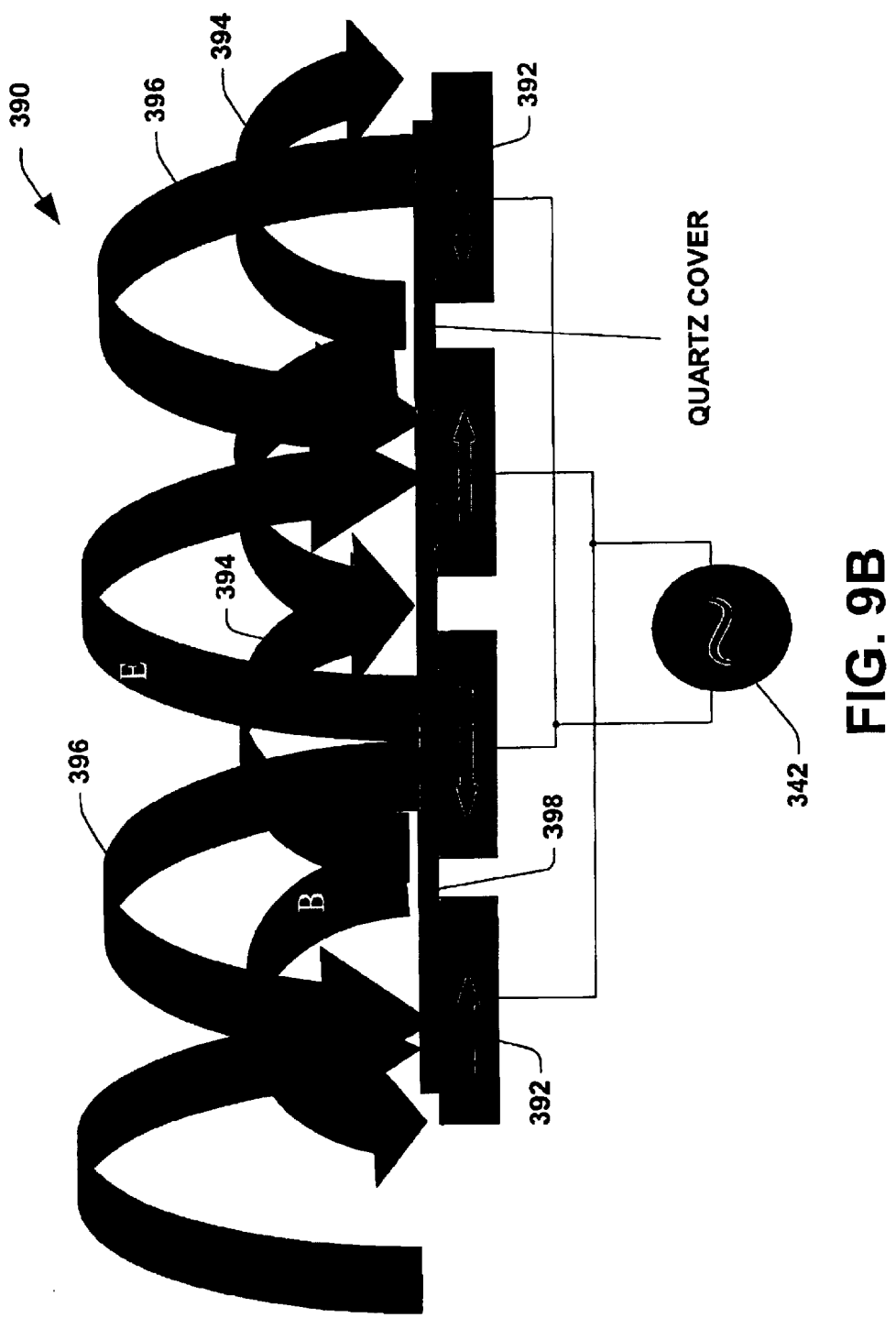
FIG. 9B is a simplified schematic diagram illustrating use of magnets as electrodes in accordance with an exemplary aspect of the present invention.

In FIG. 9B, a component 390 of the beamline uses multi-cusp magnets 392 as electrodes, thereby resulting in magnetic fields 394 and electric fields 396, as illustrated. In the structure, a quartz cover 398 resides over the magnets/ electrodes 392 and the components are embedded within a dielectric material, as may be desired. Such an arrangement is not necessary to generate the plasma, however, the arrangement is advantageous in some respects since it provides for improved beam guide lifetime and helps to reduce contamination therein.

Turning now to FIGS. 10–13B, a mass analyzer system 400 is illustrated, wherein the system is configured to mass analyze a ribbon-shaped ion beam. In one example, a ribbon beam is received from an ion source such as the ion source mentioned supra. The mass analyzer 400 of the present example is configured to mass analyze a ribbon beam for a 300 mm semiconductor wafer, and thus the ribbon beam may have a width of about 400 mm and the mass analyzer may have a width of about 600 mm.

Figure 11:
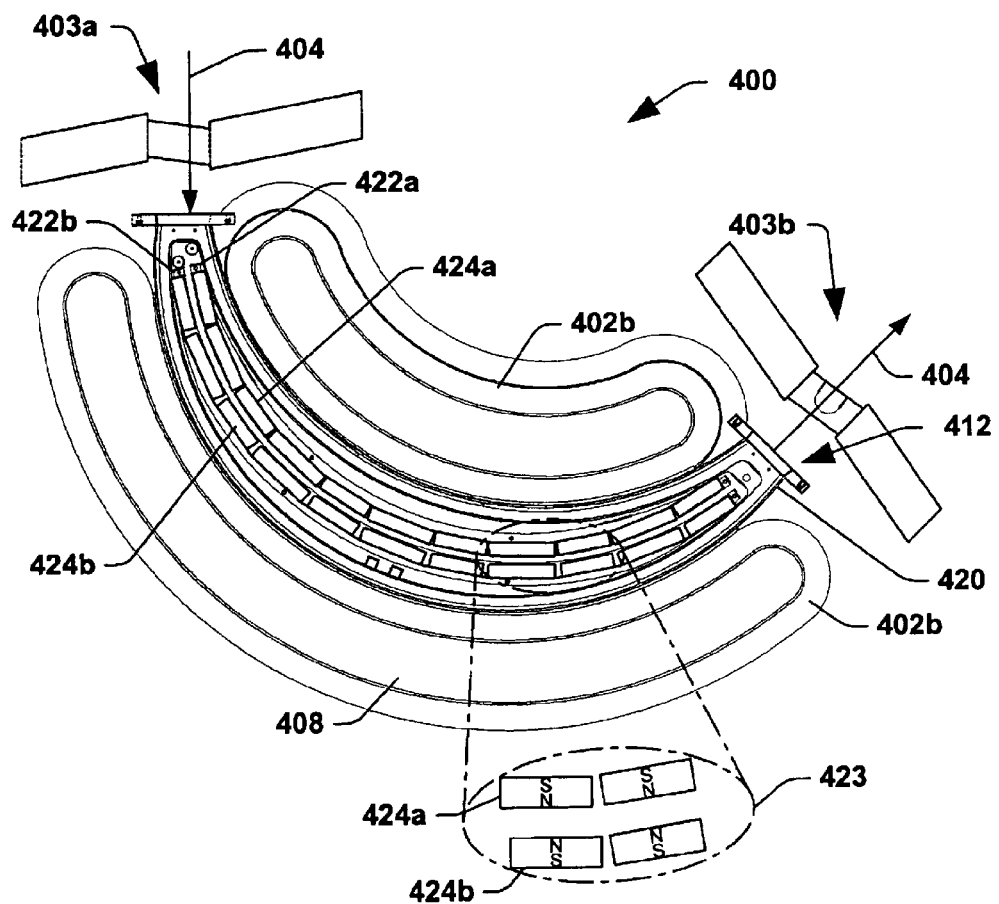
FIG. 11 is a side sectional view of a first lateral side of the exemplary mass analyzer of FIG. 10.

The mass analyzer 400 of the present example comprises a pair of coils 402, wherein a first coil (or top coil 402a) resides over a second coil (or bottom coil) 402b with a beam path 404 disposed therebetween and extending therethrough from an entrance end 403a to an exit end 403b, respectively. Each coil 402 extends in a width direction 406 at least as far as the ribbon beam, and preferably further than the ribbon beam width. Referring to FIGS. 11 and 13A—13B, each coil 402 may comprise an arcuately-shaped yoke 408 having one or more conductor wrapped therearound, for example, in a longitudinal direction along the arcuate shape of the yoke and generally parallel to the beam path 404. Upon current conducting through the coils 402, a dipole magnetic field 410 is generated in a gap 412 between the coils in a direction generally perpendicular to a direction of propagation of the ribbon beam (which is generally coincident with the arcuate beam path 404).

Figure 10:
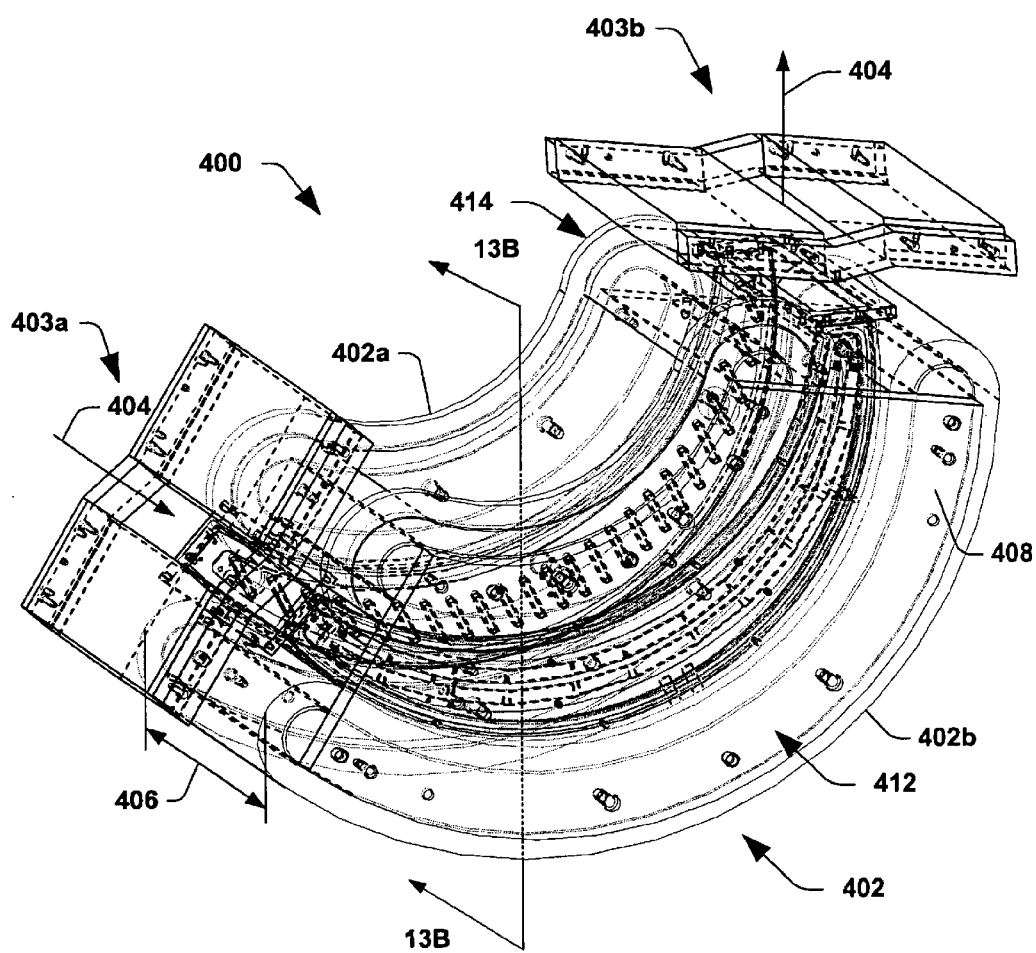
FIG. 10 is a perspective view of an exemplary mass analyzer for a ribbon beam in accordance with another aspect of the present invention.

Referring to FIGS. 10 and 11, the laterally extending coils 402 define laterally opposing sides 414 of the mass analyzer 400. Disposed on one of the sides 414a and positioned between the coils 402 and 402b is an arcuately extending, electrically insulating sidewall 420. On the sidewall 420 are two arcuately extending conductive segments 422a and 422b. Although the segments 422 are themselves conductive, the segments are electrically isolated from one another. On each segment 422 a plurality of electrodes 424a, 424b extend longitudinally along the arcuate path, wherein the electrodes 424 are concatenated therealong. Although the electrodes 424 are illustrated as a plurality of separate elements connected together electrically via the respective segment 422, it should be understood that each electrode 424 may comprise a single, arcuately extending conductive element as well as other configurations, and such alternatives are contemplated as falling within the scope of the present invention.

The electrodes 424a and 424b are coupled to a power source (not shown) such as an RF power source such that upon biasing, an electric field forms between the electrodes 424a and 424b in a direction that is generally perpendicular to the beam path 404. In one example, the electrodes 424 may be employed in conjunction with the dipole magnetic field 410 within the gap 412 (which is perpendicular to the electric field) to create electron trapping regions therein similar to a magnetron structure. As discussed above, the moving electrons collide with a gas (residual source gas or an input source gas such as xenon) for ionization thereof to generate a plasma.

In another aspect of the present invention, the electrodes 424 are also magnets (see FIG. 11), wherein each magnet 424 has a north pole and a south pole associated therewith. For example, in the first segment 422a within the enlarged region 423, the magnets have their poles aligned such that a north pole of each magnet faces inwardly toward a magnet 424b on the other conductive segment 422b, and has a south pole that faces outwardly away from the other magnet 424b. Further, in the second segment 422b, the magnets similarly have their poles aligned, however, the north pole of each magnet 424b faces inwardly toward a magnet 424a on the first conductive segment 422a, and has a south pole that faces outwardly away from the magnet 424a. With such a configuration, the magnets act as multi-cusp magnets operable to generate multi-cusp fields that extend into the arcuate passageway toward the beam path 404. Although one configuration is illustrated in FIG. 11, it should be understood that the magnet pole orientations may alternatively be reversed, wherein the south poles face inwardly and the north poles face outwardly, and such a variation is contemplated by the present invention.

The multi-cusp magnetic fields generated by the magnets 424 have portions that are perpendicular to the electric fields generated by the electrodes 424. By using the electrodes as magnets and using multi-cusp fields as the magnetic field generator, the multi-cusp fields can be tailored to maximize ionization efficiency without impacting the mass analysis function of the magnetic dipole field 410, as may be appreciated. In addition, by using the electrodes as magnets (similar structure for both the electric field generator and the magnetic field generator), the design can be simplified.

The plasma generated within the mass analyzer 400 may readily flow along magnetic field lines, such as the field lines associated with the dipole field 410, which in FIG. 11 is directed into the page and perpendicular to the ribbon beam. Thus the generated plasma is formed along the arcuate passageway in a relatively uniform manner and may then readily diffuse across the width 406 of the beam guide along the dipole field lines to provide a substantially uniform plasma across with width of the ribbon beam. Thus space charge neutralization of the ribbon beam may occur advantageously uniformly across a width thereof.

Figure 12:
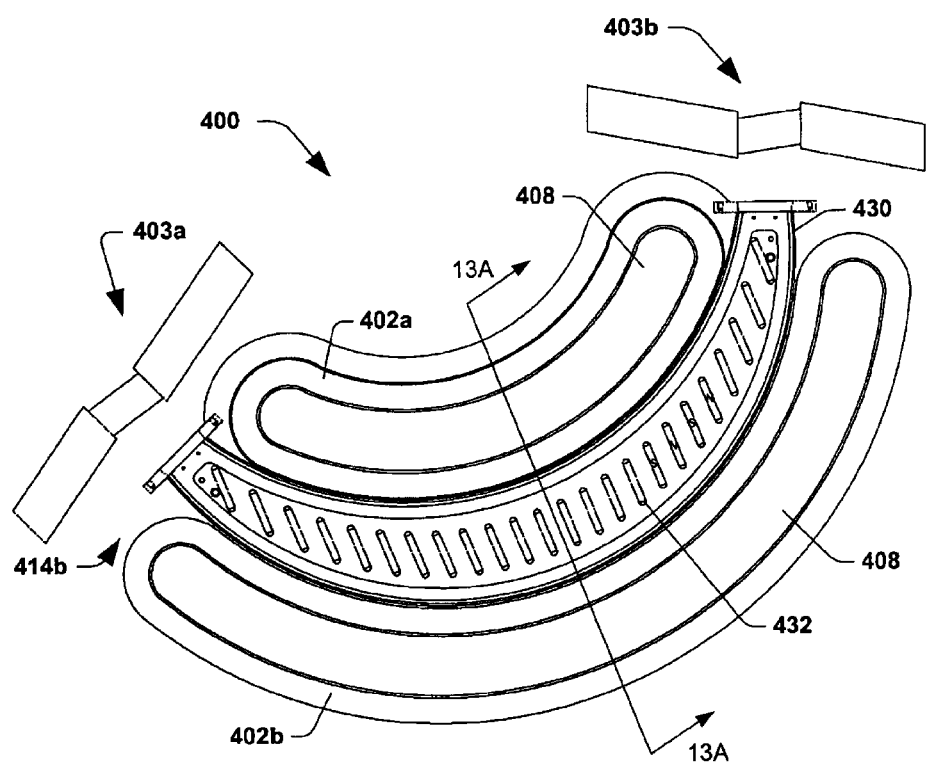
FIG. 12 is a side sectional view of a second lateral side of the mass analyzer of FIG. 10.
Figure 13:
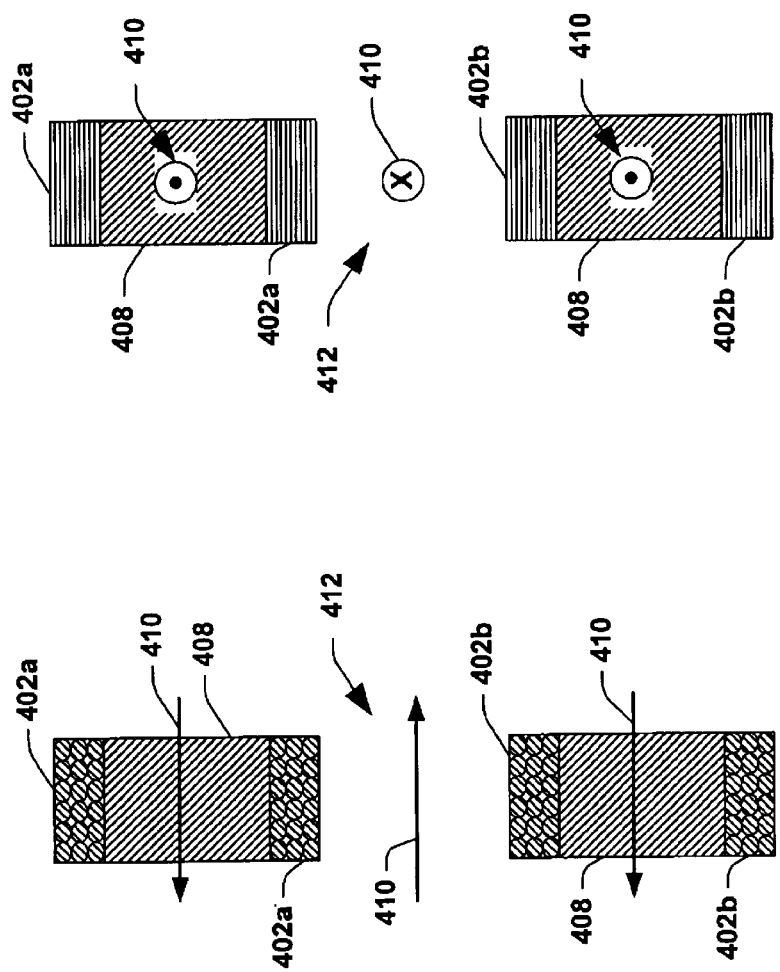
FIG. 13A is a cross section view of an exemplary mass analyzer for a ribbon beam taken along line 13A—13A of FIG. 12.
FIG. 13B is a cross section view of an exemplary mass analyzer for a ribbon beam taken along line 13B—13B of FIG. 10.

Referring now to FIGS. 10 and 12, on an opposing side of the beam guide 400 from the first sidewall 414a, an electrically insulating second sidewall 414b extends between the first and second coils 402a, 402b. The second sidewall 414b comprises an arcuately extending segment 430 that has a plurality of magnets 432 placed therealong. The magnets 432 are arranged along the segment 430 in a configuration such that the magnets are approximately rotated by 90 degrees with respect to the magnets 424 of the segments 422 on the first sidewall 420. In addition, the magnets 432 are arranged such that a north pole of one magnet is oriented next to a south pole of a neighboring magnet, as illustrated in FIG. 12. Having the second set of magnets 432 rotated with respect to the magnets 424 advantageously alters the phase of the multi-cusp fields on the opposing sides. When plasma diffuses across the ribbon beam along the dipole field lines 410 toward the multi-cusp fields formed with the magnets 432, the phase variation between the sides prevents or substantially mitigates dead zones from forming wherein plasma non-uniformities can occur. Thus the arrangement of the present invention of FIGS. 10–13B advantageously provides a plasma that is uniform throughout the beam guide 400 for space charge neutralization of a ribbon-shaped ion beam.

Figure 14:
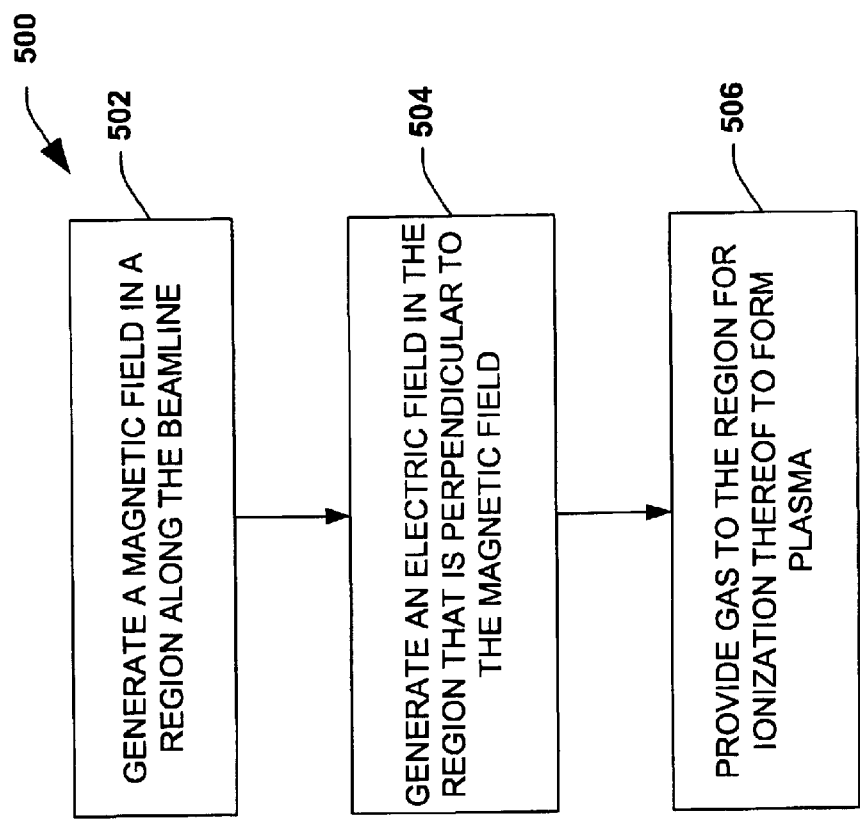
FIG. 14 is a flow chart diagram illustrating a method of generating a plasma for neutralization of space charge in an ion implantation system according to yet another aspect of the present invention.

In accordance with yet another aspect of the present invention, a method of generating a plasma in an ion implantation system is provided, as illustrated in FIG. 14 and designated at reference numeral 500. Although the methodology 500 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with one or more aspects of the present invention. In addition, not all illustrated steps may be required to implement a methodology in accordance with the present invention. Furthermore, the methodologies according to the present invention may be implemented in association with the formation and/or processing of structures illustrated and described herein as well as in association with other structures not illustrated.

The method 500 begins at 502 with the generation of a magnetic field in a region along the beamline, followed by generating an electric field that is perpendicular to the magnetic field in the region at 504. The method concludes at 506 where a gas is provided to the region, wherein electrons trapped in the region due to the perpendicular magnetic and electric fields collide with the gas, resulting in ionization of the gas and generation of plasma within the region.

Any form of magnetic field generation system and electric field generation system may be employed to generate the magnetic and electric field at 502 and 504 of the present invention. For example, the region of the beamline may comprise the mass analyzer. The magnetic field generator in such an example may comprise the mass analysis magnets employed to generate the dipole field. Alternatively, the magnetic field may be generated using a plurality of multi-cusp magnets configured to generate multi-cusp magnetic fields as described supra. Similarly, any form of electric field generator may be utilized to generate the electric field. For example, electrodes may be employed with a power source coupled thereto to bias the electrodes and generate an electric field therebetween. Further, the magnets may also be electrodes such that the same structures are employed as the magnetic field generator and the electric field generator, respectively.

The region along the beamline may comprise the mass analyzer or a drift region located downstream to the mass analyzer. Lastly, the gas provided in the region may be a residual source gas or may be input intentionally to the region via a port (not shown). Preferably, the gas employed is readily ionized and yields a high ionization efficiency, for example, Xenon. Other gases, however, may be employed and such alternatives are contemplated as falling within the scope of the present invention.

Although the invention has been illustrated and described above with respect to a certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A plasma generator for space charge neutralization of an ion beam, comprising:
   an ion implantation system operable to generate an ion beam and direct the ion beam along a beamline path;
   an electric field generation system operable to generate an electric field in a portion of the beamline path, the electric field having a portion oriented in a first direction;
   a magnetic field generation system operable to generate a magnetic field in the portion of the beamline path, the magnetic field having a portion oriented in a second direction that is perpendicular to the first direction; and
   a gas source operable to introduce a gas in a region occupied by the electric field and the magnetic field, wherein electrons in the region move in the region due to the electric field and the magnetic field, and wherein at least some of the electrons collide with the gas in the region to ionize a portion of the gas, thereby generating a plasma in the region associated with the portion of the beamline path.

2. The plasma generator of claim 1, wherein the electric field generation system comprises one or more pairs of electrodes coupled to an RF power source, thereby generating an alternating electric field between the electrodes in the region.

3. The plasma generator of claim 2, wherein the one or more pairs of electrodes comprise interdigitated electrodes.

4. The plasma generator of claim 2, wherein each of the one or more pairs of electrodes have opposing sides, a top face, and a bottom face, respectively, and wherein the opposing sides and the bottom face of the one or more pairs of electrodes are surrounded by a dielectric material, and wherein the alternating electric field between the electrodes extends from the top faces thereof.

5. The plasma generator of claim 4, further comprising a quartz layer overlying the top faces of the one or more pairs of electrodes.

6. The plasma generator of claim 1, wherein the portion of the beamline path comprises a mass analysis system.

7. The plasma generator of claim 6, wherein the mass analysis system further comprises a pair of coils having a beamline path disposed therebetween, wherein the coils are operable to generate a magnetic field substantially perpendicular to a propagation direction of the ribbon ion beam when current conducts therethrough, and wherein the pair of coils comprises the magnetic field generation system.

8. The system of claim 7, wherein the electric field generation system comprises a pair of biased electrodes operable to generate the electric field therebetween.

9. The system of claim 8, wherein the electric field generation system further comprises an RF source coupled to the pair of biased electrodes.

10. The system of claim 8, wherein the pair of coils extend in a width direction of the ribbon ion beam and define first and second opposing side portions of the mass analysis system on either end of the coils, and wherein the pair of electrodes reside on the first side portion.

11. The system of claim 10, wherein each of the pair of biased electrodes comprises an arcuate conductive segment generally following a contour of the mass analysis system and a plurality of conductive members electrically coupled and concatenated along the arcuate conductive member.

12. The system of claim 11, wherein the plurality of conductive members further comprise magnets, wherein each of the magnets has a north pole associated with a first end and a south pole associated with a second end thereof.

13. The system of claim 12, wherein magnets on one of the conductive segments are arranged so that the north and south poles are arranged in a first orientation, wherein a north pole of a magnet faces inwardly toward a magnet on the other of the conductive segments, and a south pole faces outwardly away from the magnet on the other conductive segment, and magnets on the other of the conductive segments are arranged in a second orientation, wherein a north pole of a magnet faces inwardly toward the magnet on the one conductive segment, and a south pole faces outwardly away from the magnet on the one conductive segment.

14. The system of claim 12, wherein magnets on one of the conductive segments are arranged so that the north and south poles are arranged in a first orientation, wherein a south pole of a magnet faces inwardly toward a magnet on the other of the conductive segments, and a north pole faces outwardly away from the magnet on the other conductive segment, and magnets on the other of the conductive segments are arranged in a second orientation, wherein a south pole of a magnet faces inwardly toward the magnet on the one conductive segment, and a north pole faces outwardly away from the magnet on the one conductive segment.

15. The system of claim 12, wherein the magnets are operable to generate multi-cusp fields along the first side portion of the mass analysis system, and wherein the multi-cusp fields are operable to interact with the electric field to move electrons in a region local thereto, and wherein at least some of the moving electrons are operable to ionize a gas therein, thereby generating the plasma.

16. The system of claim 15, further comprising a plurality of magnets extending along the beamline path on a second side portion of the mass analysis system opposite the arcuate conductive segments on the first side portion, and each having north and south poles associated therewith, wherein the plurality of magnets are oriented approximately ninety degrees with respect to the magnets on the arcuate conductive segments and operable to generate multi-cusp magnetic fields along the second side portion of the mass analysis system.

17. The plasma generator of claim 1, wherein the portion of the beamline path comprises a drift region downstream of a mass analysis system, wherein the plasma in the beamline path portion provides space charge neutralization for the ion beam passing therethrough.

18. The plasma generator of claim 1, wherein the ion implantation system comprises an ion source operable to generate a ribbon ion beam.

19. The plasma generator of claim 1, wherein the ion implantation system comprises a scanning system operable to scan a beam for creating a ribbon-like ion beam.

20. An ion implantation system, comprising:
   an ion source operable to generate an ion beam;
   a mass analysis system operable to receive the ion beam and deflect ions within the beam having a desired charge-to-mass ratio along a predetermined path, the mass analysis system further comprising a plasma generator operable to generate plasma therein for neutralization of space charge associated with the ion beam, wherein the plasma generator comprises:
      an electric field generation system operable to generate an electric field in the mass analysis system, the electric field having a portion oriented in a first direction;
      a magnetic field generation system operable to generate a magnetic field in the mass analysis system, the magnetic field having a portion oriented in a second direction that is perpendicular to the first direction, wherein electrons therein move due to the electric field and the magnetic field, and wherein at least some of the electrons collide with residual gas therein to ionize a portion of the gas; and an end station downstream of the mass analysis system, operable to support a workpiece for implantation thereof via the ion beam.

21. The system of claim 20, wherein the electric field generation system comprises one or more pairs of electrodes coupled to an RF power source, thereby generating an alternating electric field between the electrodes in the region.

22. The system of claim 21, wherein the one or more pairs of electrodes comprise interdigitated electrodes.

23. The system of claim 21, wherein each of the one or more pairs of electrodes have opposing sides, a top face, and a bottom face, respectively, and wherein the opposing sides and the bottom face of the one or more pairs of electrodes are surrounded by a dielectric material, and wherein the alternating electric field between the electrodes extends from the top faces thereof.

24. The system of claim 23, further comprising a quartz layer overlying the top faces of the one or more pairs of electrodes.

25. The system of claim 20, wherein the ion beam comprises a ribbon-shaped ion beam.

26. The system of claim 25, wherein the mass analysis system further comprises a pair of coils having a beamline path disposed therebetween, wherein the coils are operable to generate a magnetic field substantially perpendicular to a propagation direction of the ribbon ion beam when current conducts therethrough.

27. The system of claim 26, wherein the pair of coils comprises the magnetic field generation system.

28. The system of claim 26, wherein the electric field generation system comprises a pair of biased electrodes operable to generate the electric field therebetween.

29. The system of claim 28, wherein the electric field generation system further comprises an RF source coupled to the pair of biased electrodes.

30. The system of claim 28, wherein the pair of coils extend in a width direction of the ribbon ion beam and define first and second opposing side portions of the mass analysis system on either end of the coils, and wherein the pair of electrodes reside on the first side portion.

31. The system of claim 30, wherein each of the pair of biased electrodes comprises an arcuate conductive segment generally following a contour of the mass analysis system and a plurality of conductive members electrically coupled and concatenated along the arcuate conductive member.

32. The system of claim 31, wherein the electric field generation system further comprises an RF source coupled to the arcuate conductive members, thereby generating an RF electric field between the conductive members residing on one of the arcuate conductive segments and the conductive members on the on the other of the arcuate conductive segments, respectively, and wherein a direction of the RF electric field is generally perpendicular to a magnetic field within the beamline path.

33. The system of claim 31, wherein the plurality of conductive members further comprise magnets, wherein each of the magnets has a north pole associated with a first end and a south pole associated with a second end thereof.

34. The system of claim 33, wherein magnets on one of the conductive segments are arranged so that the north and south poles are arranged in a first orientation, wherein a north pole of a magnet faces inwardly toward a magnet on the other of the conductive segments, and a south pole faces outwardly away from the magnet on the other conductive segment, and magnets on the other of the conductive segments are arranged in a second orientation, wherein a north pole of a magnet faces inwardly toward the magnet on the one conductive segment, and a south pole faces outwardly away from the magnet on the one conductive segment.

35. The system of claim 33, wherein magnets on one of the conductive segments are arranged so that the north and south poles are arranged in a first orientation, wherein a south pole of a magnet faces inwardly toward a magnet on the other of the conductive segments, and a north pole faces outwardly away from the magnet on the other conductive segment, and magnets on the other of the conductive segments are arranged in a second orientation, wherein a south pole of a magnet faces inwardly toward the magnet on the one conductive segment, and a north pole faces outwardly away from the magnet on the one conductive segment.

36. The system of claim 33, wherein the magnets are operable to generate multi-cusp fields along the first side portion of the mass analysis system, and wherein the multi-cusp fields are operable to interact with the electric field to move electrons in a region local thereto, and wherein at least some of the moving electrons are operable to ionize a gas therein, thereby generating the plasma.

37. The system of claim 36, further comprising a plurality of magnets extending along the beamline path on a second side portion of the mass analysis system opposite the arcuate conductive segments on the first side portion, and each having north and south poles associated therewith, wherein the plurality of magnets are oriented approximately ninety degrees with respect to the magnets on the arcuate conductive segments and operable to generate multi-cusp magnetic fields along the second side portion of the mass analysis system.

38. A method of generating a plasma in an ion implantation system, comprising:

generating an electric field and a magnetic field having a portion generally perpendicular to a portion of the electric field in a region to move electrons within the region; and providing a gas in the region, wherein at least some of the moving electrons collide with portions of the gas to ionize the gas, thereby generating the plasma in the region.

39. The method of claim 38, wherein generating the generally perpendicular electric and magnetic field comprises:

placing a pair of electrodes in a mass analysis guide having a magnetic field oriented generally perpendicular to a direction of propagation of an ion beam in the ion implantation system; and biasing the pair of electrodes, thereby generating the electric field therebetween, wherein the pair of electrodes are positioned such that a direction of the resultant electric field is generally perpendicular to the magnetic field in the mass analysis system.

40. The method of claim 39, wherein generating the generally perpendicular electric and magnetic field comprises:

configuring a plurality of conductive magnet members along two conductive, electrically isolated segments, wherein each of the conductive magnet members have a north pole and a south pole associated therewith, wherein the magnet members are operable to generate multi-cusp magnetic fields therebetween; and biasing the plurality of conductive magnetic members on one segment and the plurality of conductive members on the other segment, thereby generating an electric field therebetween.

41. The method of claim 40, wherein the plasma is generated in a mass analysis system within the ion implantation system, and the mass analysis system comprises an arcuate passageway having first and second opposing sides extending along the arcuate passageway, and wherein the two conductive, electrically isolated segments extend along a first side spaced apart from one another.

42. The method of claim 41, wherein the conductive magnetic members associated with one conductive segment are configured to extend along the arcuate passageway, wherein a south pole of each member faces outwardly away from center portion of the arcuate passageway, and a north pole of each member faces inwardly toward the center portion of the arcuate passageway.

43. The method of claim 42, wherein the conductive magnetic members associated with the other conductive segment are configured to extend along the arcuate passageway, wherein a south pole of each member faces outwardly away from a center portion of the arcuate passageway, and a north pole of each member faces inwardly toward the center portion of the arcuate passageway.

44. The method of claim 38, wherein generating the electric field comprises:

configuring a pair of interdigitated electrodes along a beamline path of the ion implantation system; and biasing the pair of interdigitated electrodes to generate the electric field therebetween.

45. The method of claim 44, wherein the pair of interdigitated electrodes are located within a mass analysis system, and wherein the interdigitated electrodes are configured to generate the electric field therebetween having an orientation generally perpendicular to a magnetic field within the mass analysis system employed for deflecting an ion beam propagating therethrough.

46. The method of claim 45, wherein the mass analysis system comprises an arcuate passageway having first and second opposing sides, and wherein the interdigitated electrodes are located on one of the first and second opposing sides.

47. The method of claim 38, wherein providing a gas comprises employing any residual gas within the region.

* * * * *